United States Patent
Sato et al.

(10) Patent No.: US 10,602,619 B2
(45) Date of Patent: Mar. 24, 2020

(54) ANISOTROPIC CONDUCTIVE CONNECTION STRUCTURE BODY

(71) Applicant: DEXERIALS CORPORATION, Tokyo (JP)

(72) Inventors: Daisuke Sato, Tokyo (JP); Akifumi Higuchi, Tokyo (JP)

(73) Assignee: DEXERIALS CORPORATION, Tokyo (JP)

(*) Notice: Subject to any disclaimer, the term of this patent is extended or adjusted under 35 U.S.C. 154(b) by 9 days.

(21) Appl. No.: 16/077,785

(22) PCT Filed: Mar. 27, 2017

(86) PCT No.: PCT/JP2017/012408
§ 371 (c)(1),
(2) Date: Aug. 14, 2018

(87) PCT Pub. No.: WO2017/170412
PCT Pub. Date: Oct. 5, 2017

(65) Prior Publication Data
US 2019/0053383 A1 Feb. 14, 2019

(30) Foreign Application Priority Data
Mar. 31, 2016 (JP) .................. 2016-073087

(51) Int. Cl.
*H05K 3/32* (2006.01)
*H05K 3/36* (2006.01)
(Continued)

(52) U.S. Cl.
CPC ............. *H05K 3/323* (2013.01); *H01B 5/16* (2013.01); *H01L 24/13* (2013.01); *H01L 24/29* (2013.01);
(Continued)

(58) Field of Classification Search
None
See application file for complete search history.

(56) References Cited

U.S. PATENT DOCUMENTS 5,965,064 A * 10/1999 Yamada .................. C09J 9/02
252/512
8,546,257 B2 * 10/2013 Kraus .............. G01N 33/54366
257/780
(Continued)

FOREIGN PATENT DOCUMENTS

JP    H11-031698 A    2/1999
JP    2001-028280 A   1/2001
(Continued)

OTHER PUBLICATIONS

Jun. 14, 2019, Korean Office Action issued for related KR Application No. 10-2018-7013065.

*Primary Examiner* — Timothy J Thompson
*Assistant Examiner* — Muhammed Azam
(74) *Attorney, Agent, or Firm* — Paratus Law Group, PLLC

(57) ABSTRACT

An anisotropic conductive connection structure body includes: a first electrode terminal on a surface of which a protruding portion is formed; a second electrode terminal; and an anisotropic conductive adhesive layer containing electrically conductive particles that provide conduction between the first electrode terminal and the second electrode terminal. A ratio of a height of the protruding portion to a before-compression particle size of the electrically conductive particle is less than 60%, an opening area ratio of the first electrode terminal is more than or equal to 55%, and a height of the second electrode terminal is more than or equal to 6 μm.

6 Claims, 1 Drawing Sheet

(51) Int. Cl.
  *H01L 23/00* (2006.01)
  *H01B 5/16* (2006.01)
(52) U.S. Cl.
  CPC ............ *H01L 24/92* (2013.01); *H05K 3/36* (2013.01); *H01L 24/16* (2013.01); *H01L 24/32* (2013.01); *H01L 24/81* (2013.01); *H01L 24/83* (2013.01); *H01L 2224/13019* (2013.01); *H01L 2224/13023* (2013.01); *H01L 2224/16148* (2013.01); *H01L 2224/16238* (2013.01); *H01L 2224/29499* (2013.01); *H01L 2224/32145* (2013.01); *H01L 2224/32225* (2013.01); *H01L 2224/73204* (2013.01); *H01L 2224/83203* (2013.01)

(56) References Cited

U.S. PATENT DOCUMENTS

| | | | |
|---|---|---|---|
| 9,673,168 B2 | 6/2017 | Saruyama et al. | |
| 9,960,138 B2 | 5/2018 | Saruyama et al. | |
| 10,269,467 B2* | 4/2019 | Tsukao | H01B 5/16 |
| 10,272,598 B2* | 4/2019 | Shinohara | C09J 5/06 |
| 2002/0056906 A1* | 5/2002 | Kajiwara | H01L 24/11 |
| | | | 257/697 |
| 2004/0113215 A1* | 6/2004 | Shimada | G01H 3/12 |
| | | | 257/414 |
| 2004/0150082 A1* | 8/2004 | Kajiwara | H01L 21/561 |
| | | | 257/678 |
| 2006/0267218 A1* | 11/2006 | Hozoji | H05K 3/321 |
| | | | 257/782 |
| 2007/0257362 A1* | 11/2007 | Karashima | H01L 21/4853 |
| | | | 257/737 |
| 2008/0284046 A1* | 11/2008 | Karashima | H01L 21/6835 |
| | | | 257/778 |
| 2010/0139947 A1* | 6/2010 | Kojima | C09J 9/02 |
| | | | 174/126.1 |
| 2010/0277884 A1* | 11/2010 | Arifuku | C08G 18/3256 |
| | | | 361/803 |
| 2011/0169022 A1* | 7/2011 | Shiota | G02F 1/13452 |
| | | | 257/88 |
| 2011/0220398 A1* | 9/2011 | Sakuyama | H01L 21/4853 |
| | | | 174/257 |
| 2015/0123292 A1* | 5/2015 | Kim | C09J 163/00 |
| | | | 257/783 |
| 2016/0056123 A1* | 2/2016 | Morita | H01L 24/27 |
| | | | 438/118 |
| 2019/0053383 A1* | 2/2019 | Sato | H05K 3/323 |

FOREIGN PATENT DOCUMENTS

| | | |
|---|---|---|
| JP | 2004-186411 A | 7/2004 |
| JP | 2005-093978 A | 4/2005 |
| JP | 2015-146379 A | 8/2015 |
| KR | 10-2014-0138822 A | 12/2014 |

* cited by examiner

ANISOTROPIC CONDUCTIVE CONNECTION STRUCTURE BODY

CROSS REFERENCE TO PRIOR APPLICATION

This application is a National Stage Patent Application of PCT International Patent Application No. PCT/JP2017/012408 (filed on Mar. 27, 2017) under 35 U.S.C. § 371, which claims priority to Japanese Patent Application No. 2016-073087 (filed on Mar. 31, 2016), which are all hereby incorporated by reference in their entirety.

TECHNICAL FIELD

The present invention relates to an anisotropic conductive connection structure body.

BACKGROUND ART

A flip chip bonding method is known as a method for connecting a plurality of electronic parts (for example, IC chips, rigid boards, flexible boards, and the like) having electrode terminals. In the flip chip bonding method, electrode terminals of a plurality of electronic parts are connected together in a state where the electrode terminals are opposed.

As an example of such a flip chip bonding method, an ultrasonic connection method is known. In this method, electrode terminals of a plurality of electronic parts are brought into contact with each other. Next, the contact portion between electrode terminals is oscillated by an ultrasonic wave. Thereby, the electrode terminals are connected together. In this method, the electrode terminals of both electronic parts are formed of gold. Next, filler (what is called underfill) is put in a space around the connection portion, and is hardened.

As another example of the flip chip bonding method, a eutectic method is known. In this method, electrode terminals of a plurality of electronic parts are brought into contact with each other. Next, the contact portion between electrode terminals is heated. Thereby, the electrode terminals form a eutectic, and are connected together. In this method, for example, the electrode terminal of one electronic part is formed of gold, and the electrode terminal of the other electronic part is formed of tin. Next, filler (what is called underfill) is put in a space around the connection portion, and is hardened.

However, in the ultrasonic connection method, the electrode terminal is largely oscillated by an ultrasonic weave, and therefore connection failure, a short circuit, etc. may occur. Furthermore, an electrode terminal to which the ultrasonic connection method can be applied needs to be formed of an expensive material such as gold, and therefore the cost is increased. Furthermore, the putting-in and hardening of filler are needed, and therefore the cost is increased also in this respect. Moreover, the number of processes is increased.

On the other hand, in the eutectic method, the connection portion between electrode terminals is heated, and the heating temperature at this time is very high. For example, the heating temperature is approximately 400° C. Hence, in the case where the electronic part is a flexible board, the flexible board may deform during heating. If the flexible board is deformed, the position of the electrode terminal on the flexible board etc. may be shifted. Therefore, connection failure, a short circuit, etc. may occur. Furthermore, there is also a problem regarding filler like in the ultrasonic connection method.

Thus, these days, for example as disclosed in Patent Literatures 1 and 2, a method of connecting electrode terminals together by anisotropic conductive connection using an anisotropic conductive film is drawing attention as a flip chip bonding method. In this method, an ultrasonic wave is not needed, and therefore a problem regarding an ultrasonic wave does not occur. Furthermore, although also a connection method using an anisotropic conductive film needs a heating process, the heating temperature is lower than in the eutectic method. Moreover, a hardenable resin forming the anisotropic conductive film functions as filler, and therefore the process of putting in and hardening filler separately is not needed.

CITATION LIST

Patent Literature

Patent Literature 1: JP H11-31698A
Patent Literature 2: JP 2005-93978A

SUMMARY OF INVENTION

Technical Problem

Meanwhile, in the case where the electronic part is an IC chip, a bump is formed as an electrode terminal on the IC chip. In many cases a protruding portion is formed in a peripheral portion of a surface of the bump (that is, a surface facing an electrode terminal of the other electronic part). The protruding portion is often formed over the entire outer edge of the surface of the bump. Such a protruding portion has so far been considered to be a cause of connection failure, and hence has been considered to be preferably made as small as possible. Specifically, if electrically conductive particles are buried in a concavity (what is called a dimple) formed by the protruding portion, the electrically conductive particles may fail to be compressed sufficiently. Hence, connection failure may occur. Thus, in the technologies disclosed in Patent Literatures 1 and 2, the protruding portion is made as small as possible.

However, in the technologies disclosed in Patent Literatures 1 and 2, it takes very great time and effort to downsize the protruding portion. Specifically, in the technology disclosed in Patent Literature 1, in order to downsize the protruding portion, the opening area of an opening portion formed in an insulating layer is made very small. Here, the insulating layer is a layer covering the function surface of the IC chip, and the opening portion is formed on an electrode pad of the IC chip. The bump is connected to the electrode pad via the opening portion of the insulating layer. In the technology disclosed in Patent Literature 1, the protruding portion is downsized by reducing the opening area of such an opening portion. However, the process of reducing the opening area takes significant time and effort. On the other hand, in the technology disclosed in Patent Literature 2, a process of applying an ultrasonic wave to the protruding portion is needed separately in order to downsize the protruding portion.

The present inventors further investigated technology to downsize the protruding portion, and have found that simple downsizing of the protruding portion alone may rather cause an increase in connection resistance and a reduction in reliability. In addition, these days, further improvement in the connection strength of the anisotropic conductive connection portion is strongly desired.

Thus, the present invention has been made in view of the problem mentioned above, and an object of the present invention is to provide a new and improved anisotropic conductive connection structure body that reduces the connection resistance of an anisotropic conductive connection portion between electrode terminals and can enhance reliability, and can enhance the connection strength.

Solution to Problem

According to an aspect of the present invention in order to achieve the above object, there is provided an anisotropic conductive connection structure body including: a first electrode terminal on a surface of which a protruding portion is formed; a second electrode terminal; and an anisotropic conductive adhesive layer containing electrically conductive particles that provide conduction between the first electrode terminal and the second electrode terminal. A ratio of a height of the protruding portion to a before-compression particle size of the electrically conductive particle is less than 60%, an opening area ratio of the first electrode terminal is more than or equal to 55%, and a height of the second electrode terminal is more than or equal to 6 µm.

According to the present aspect, the protruding portion can trap a larger amount of electrically conductive particles in a concavity inside the protruding portion. Furthermore, electrically conductive particles in the concavity are compressed sufficiently. Therefore, the connection resistance is reduced, and reliability is improved. Further, a sufficient amount of the adhesive flows in between second electrode terminals, and therefore the first electrode terminal and the second electrode terminal are strongly adhered together.

Here, a ratio of a hardness of the first electrode terminal to a hardness of the second electrode terminal may be larger than 10%.

In addition, a concavity surrounded by the protruding portion may be formed on a surface of the first electrode terminal, and a ratio of a before-compression particle size of the electrically conductive particle to a short side length of the concavity of the first electrode terminal may be less than 10%.

In addition, a concavity surrounded by the protruding portion may be formed on a surface of the first electrode terminal, and an average occupation area ratio of the electrically conductive particles existing in the concavity of the first electrode terminal may be less than 20%.

In addition, the protruding portion may be formed over an entire outer edge of a surface of the first electrode terminal.

In addition, the first electrode terminal may be a bump formed on a first electronic part.

Advantageous Effects of Invention

As described above, according to the present invention, the connection resistance of an anisotropic conductive connection portion between electrode terminals is reduced and reliability can be enhanced, and the connection strength can be enhanced.

DESCRIPTION OF EMBODIMENTS

Figure 1:
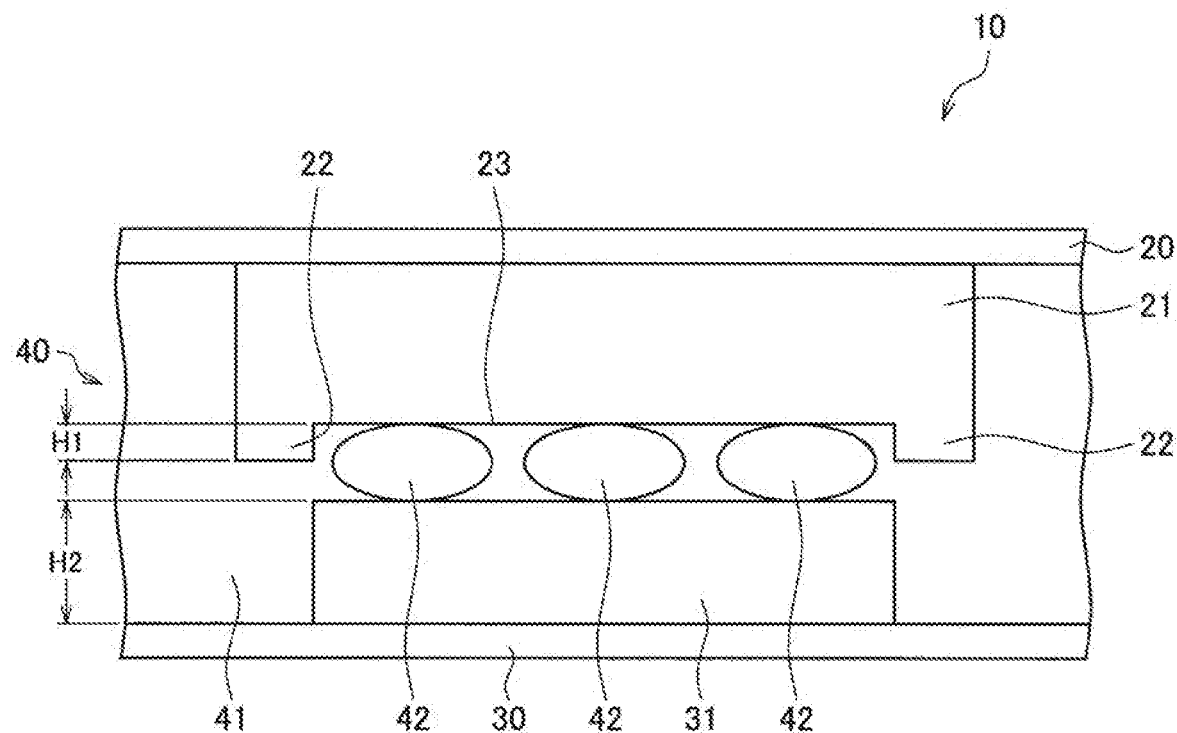
FIG. 1 is a side cross-sectional view showing a rough configuration of an anisotropic conductive connection structure body 10 according to the present embodiment.

Hereinafter, (a) preferred embodiment(s) of the present invention will be described in detail with reference to the appended drawings. Note that, in this specification and the appended drawings, structural elements that have substantially the same function and structure are denoted with the same reference numerals, and repeated explanation of these structural elements is omitted.

<1. Configuration of Anisotropic Conductive Connection Structure Body>

Figure 2:
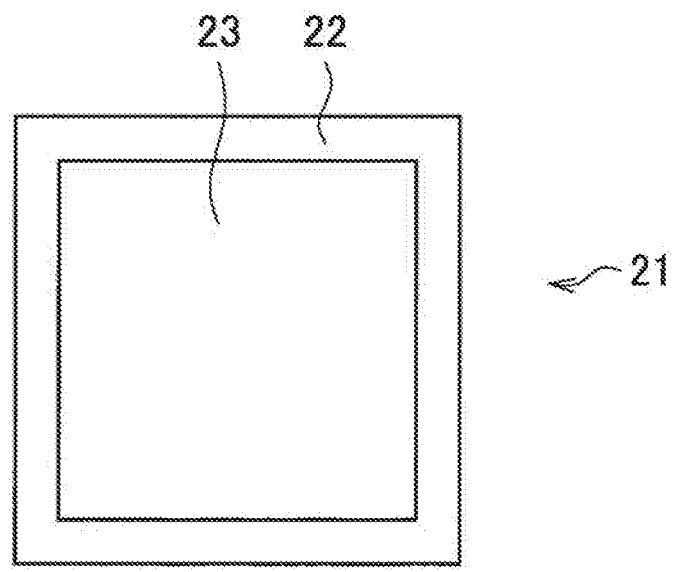
FIG. 2 is a plan view showing a surface structure of a first electrode terminal according to the embodiment.

First, the configuration of an anisotropic conductive connection structure body 10 according to the present embodiment is described on the basis of FIG. 1 and FIG. 2.

The anisotropic conductive connection structure body 10 includes a first electronic part 20, a first electrode terminal 21 formed on the first electronic part 20, a second electronic part 30, a second electrode terminal 31 formed on the second electronic part 30, and an adhesive layer 40.

The first electronic part 20 is, for example, an electronic circuit board. The type of the electronic circuit board is not particularly questioned, and may be an IC chip, various rigid boards (for example, a glass epoxy board or the like), a flexible board, or the like. For example, the first electronic part 20 is an IC chip. In the case where the first electronic part 20 is an IC chip, the first electrode terminal 21 is a bump. In the bump, a protruding portion 22 is likely to be formed.

The first electrode terminal 21 is formed on the first electronic part 20. The first electrode terminal 21 is made conductive with an electronic circuit included in the first electronic part 20. The protruding portion 22 is formed on a surface of the first electrode terminal 21 (that is, a surface facing the second electronic part 30). In the case where the first electronic part 20 is an IC chip, the first electrode terminal 21 is a bump. However, it is sufficient that the first electrode terminal 21 be one in which the protruding portion 22 is formed. Thus, the first electrode terminal 21 is not limited to a bump.

The material that forms the first electrode terminal 21 is not particularly limited as long as it has electrical conductivity. The material that forms the first electrode terminal 21 is preferably a metal such as aluminum, silver, nickel, copper, or gold, for example.

The protruding portion 22 is formed on a surface of the first electrode terminal 21. As shown in FIG. 2, the protruding portion 22 is formed over the entire outer edge of the surface of the first electrode terminal 21. In the case where the first electrode terminal 21 is a bump, the protruding portion 22 is often formed over the entire outer edge of the surface of the first electrode terminal 21. The shape of the protruding portion 22 is not limited to that shown in FIG. 1 as a matter of course, but is preferably the shape of FIG. 2. In this case, the protruding portion 22 can trap electrically conductive particles 42 more reliably.

A concavity 23 (what is called a dimple) surrounded by the protruding portion 22 is formed on the surface of the first electrode terminal 21. Such a protruding portion 22 and a concavity 23 have so far been considered to be a cause of connection failure, and therefore have been considered to be preferably made as small as possible. However, in the present embodiment, the protruding portion 22 is positively utilized. Specifically, electrically conductive particles 42 are trapped by the protruding portion 22, and thereby the electrically conductive particles 42 can be held between the first electrode terminal 21 and the second electrode terminal 31. Here, the electrically conductive particles 42 are contained in the adhesive layer 40. Thereby, in the present embodiment, the connection resistance is reduced, and reliability can be enhanced. Specifically, the initial resistance can be reduced, and the fraction defective after a cooling/heating cycle test can be reduced.

The second electronic part 30 is, for example, an electronic circuit board. The type of the electronic circuit board is not particularly questioned, and may be an IC chip, various rigid boards (for example, a glass epoxy board or the like), a flexible board, or the like. For example, the second electronic part 30 is a flexible board. In the case where the second electronic part 30 is a flexible board, the height H2 of the second electrode terminal 31 easily satisfies a requirement described later. The type of the flexible board is not particularly limited either, and may be a polyimide board, for example.

The second electrode terminal 31 is formed on the second electronic part 30. The second electrode terminal 31 is made conductive with an electronic circuit included in the second electronic part 30. The material that forms the second electrode terminal 31 is not particularly limited as long as it has electrical conductivity. Examples of the material that forms the second electrode terminal 31 include metals such as aluminum, silver, nickel, copper, and gold. The metal forming the second electrode terminal 31 may be plated with various metals.

The adhesive layer 40 is a layer in which an anisotropic conductive adhesive is hardened, and contains a hardened resin layer 41 and electrically conductive particles 42. That is, the adhesive layer 40 connects the first electrode terminal 21 and the second electrode terminal 31 together by anisotropic conductive connection.

The anisotropic conductive adhesive contains a hardenable resin and electrically conductive particles 42. The hardenable resin contains a polymerizable compound and a hardening initiator. The polymerizable compound is a resin that is hardened by the hardening initiator. The hardened polymerizable compound, that is, the hardened resin layer 41 adheres the first electrode terminal 21 and the second electrode terminal 31 together in the adhesive layer 40, and holds the electrically conductive particles 42 in the adhesive layer 40. Examples of the polymerizable compound include an epoxy polymerizable compound, an acrylic polymerizable compound, and the like. The epoxy polymerizable compound is a monomer, an oligomer, or a prepolymer containing one or two or more epoxy groups in a molecule. As the epoxy polymerizable compound, various bisphenol-type epoxy resins (a bisphenol A-type, a bisphenol F-type, etc.), a novolac-type epoxy resin, various modified epoxy resins of rubber, a urethane, and the like, a naphthalene-type epoxy resin, a biphenyl-type epoxy resin, a phenol novolac-type epoxy resin, a stilbene-type epoxy resin, a triphenol-methane-type epoxy resin, a dicyclopentadiene-type epoxy resin, and a triphenylmethane-type epoxy resin, prepolymers of these, and the like are given.

The acrylic polymerizable compound is a monomer, an oligomer, or a prepolymer containing one or two or more acrylic groups in a molecule. Examples of the acrylic polymerizable compound include methyl acrylate, ethyl acrylate, isopropyl acrylate, isobutyl acrylate, an epoxy acrylate, ethylene glycol diacrylate, diethylene glycol diacrylate, trimethylolpropane triacrylate, dimethyloltricyclodecane diacrylate, tetramethylene glycol tetraacrylate, 2-hydroxy-1,3-diacryloxypropane, 2,2-bis[4-(acryloxymethoxy)phenyl]propane, 2,2-bis[4-(acryloxyethoxy)phenyl]propane, dicyclopentenyl acrylate, tricyclodecanyl acrylate, tris(acryloxyethyl) isocyanurate, a urethane acrylate, and the like. In the present embodiment, among the polymerizable compounds enumerated above, any one may be used, or two or more may be used in combination arbitrarily.

The hardening initiator is, for example, a thermal curing initiator. The thermal curing initiator is a material that hardens by heat together with the polymerizable compound mentioned above. The type of the thermal curing initiator is not particularly limited, either. Examples of the thermal curing initiator include a thermal anionic or thermal cationic curing initiator that cures an epoxy polymerizable compound, a thermal radical polymerization-type curing agent that cures an acrylic polymerizable compound, and the like. In the present embodiment, an appropriate thermal curing initiator may be selected in accordance with the polymerizable compound. Other examples of the hardening initiator include photocuring initiators. Examples of the photocuring initiator include a photo-anionic or photo-cationic curing initiator that cures an epoxy polymerizable compound, a photo-radical polymerization-type curing agent that cures an acrylic polymerizable compound, and the like. In the present embodiment, an appropriate photocuring initiator may be selected in accordance with the polymerizable compound.

As well as the components mentioned above, a film-forming resin, various additives, etc. may be put in the anisotropic conductive adhesive. The film-forming resin is added to the anisotropic conductive adhesive when it is desired to form a film shape in order to facilitate the handling of the anisotropic conductive adhesive. As the film-forming resin, for example, various resins such as an epoxy resin, a phenoxy resin, a polyester urethane resin, a polyester resin, a polyurethane resin, an acrylic resin, a polyimide resin, and a butyral resin may be used. In the present embodiment, among these film-forming resins, only one may be used, or two or more may be used in combination arbitrarily. The film-forming resin is preferably a phenoxy resin from the viewpoint of improving film formability and adhesion reliability. In the case where the anisotropic conductive adhesive is formed in a film shape, the thickness of the film (that is, the anisotropic conductive film) is not particularly limited. However, if the film is too thick, the amount of unnecessary resin is too large, and a problem arises with fluidity etc. Hence, the film thickness is preferably less than or equal to 100 μm, and more preferably less than or equal to 40 μm. If the film is too thin, handling is difficult; hence, the film thickness is preferably more than or equal to 5 μm, and more preferably more than or equal to 12 μm.

As an additive that can be added to the anisotropic conductive adhesive, a silane coupling agent, an inorganic filler, a coloring agent, an antioxidant, an antirust, etc. are given. The type of the silane coupling agent is not particularly limited. Examples of the silane coupling agent include an epoxy-based, amino-based, mercapto-sulfide-based, or ureide-based silane coupling agent, and the like. In the case where these silane coupling agents are added to the anisotropic conductive adhesive, adhesiveness can be improved depending on the material of the matrix.

The inorganic filler is an additive for adjusting the fluidity and the film strength, particularly the minimum melt viscosity described later, of the anisotropic conductive adhesive. The type of the inorganic filler is not particularly limited, either. Examples of the inorganic filler include silica, talc, titanium oxide, calcium carbonate, magnesium oxide, and the like.

The electrically conductive particles 42 are a material that connects the first electrode terminal 21 and the second electrode terminal 31 together in the adhesive layer 40 by anisotropic conductive connection. Specifically, electrically conductive particles 42 sandwiched by the first electrode terminal 21 and the second electrode terminal 31 in the adhesive layer 40 provide conduction between the first electrode terminal 21 and the second electrode terminal 31. On the other hand, other electrically conductive particles 42 (for example, electrically conductive particles 42 that have entered the gap between first electrode terminals 21, electrically conductive particles 42 that have entered the gap between second electrode terminals 31, etc.) do not provide conduction between any terminals (that is, do not cause a short circuit in a form in which electrically conductive particles 42 are in a line between first electrode terminals 21, a short circuit in a form in which electrically conductive particles 42 are in a line between second electrode terminals 31, or the like).

Therefore, the electrically conductive particles 42 can provide conduction between the first electrode terminal 21 and the second electrode terminal 31 while maintaining insulation between first electrode terminals 21 and between second electrode terminals 31 in the adhesive layer 40. That is, the electrically conductive particles 42 provide conduction and anisotropic conductive connection between the first electrode terminal 21 and the second electrode terminal 31 by being sandwiched by them in the adhesive layer 40. The electrically conductive particles 42 may be dispersed in an anisotropic conductive agent to such a degree as not to short-circuit, or may be arranged so as to be individually independent. This arrangement is set in accordance with the size of each electrode terminal, the distance in the arrangement direction between electrode terminals, etc., as appropriate, and may be regular. The electrically conductive particles 42 satisfy requirements described later. The before-compression particle size of the electrically conductive particle 42 is not particularly limited as long as requirements described later are satisfied, and is 1 to 10 μm as an example. Here, as mentioned above, the anisotropic conductive adhesive before anisotropic conductive connection may be one formed as a film body in advance.

<2. Requirements to be Satisfied by Anisotropic Conductive Connection Structure Body>

Next, requirements to be satisfied by the anisotropic conductive connection structure body 10 are described. When the anisotropic conductive connection structure body 10 satisfies the following requirements, the protruding portion 22 can trap electrically conductive particles 42. As a result, the connection resistance can be reduced, and reliability is improved. Furthermore, the adhesive layer 40 can strongly adhere the first electrode terminal 21 and the second electrode terminal 31 together. The anisotropic conductive connection structure body 10 needs to satisfy at least requirements 1 to 3. The anisotropic conductive connection structure body 10 preferably further satisfies requirement 4 and the subsequent requirements. When evaluating whether the following requirements are satisfied or not, the structure of each electrode etc. may be observed with a scanning electron microscope (SEM) or the like. For example, the height H1 of the protruding portion 22 can be measured by observing the first electrode terminal 21 with a SEM. The following parameters may be the arithmetic average value of measurement values measured for a plurality of anisotropic conductive connection structure bodies 10, or any value may be used as the representative value.

(2-1. Requirement 1)

The ratio of the height H1 of the protruding portion 22 to the before-compression particle size of the electrically conductive particle 42 (hereinafter, occasionally referred to as a "protruding portion height/particle size ratio") is less than 60%. Here, the before-compression particle size is the particle size before compressing the electrically conductive particle 42. If the protruding portion height/particle size ratio is more than or equal to 60%, the protruding portion 22 inhibits the compression of the electrically conductive particle 42. That is, electrically conductive particles 42 trapped in the concavity 23 are not compressed sufficiently. As a result, the connection resistance is increased, and reliability is worsened. When the protruding portion height/particle size ratio is less than 60%, the protruding portion 22 can trap electrically conductive particles 42 in the concavity 23. Furthermore, electrically conductive particles 42 are compressed sufficiently. The protruding portion height/particle size ratio is preferably less than 50%.

The lower limit value of the protruding portion height/particle size ratio is not particularly limited; but if it is too small, there is a possibility that the protruding portion 22 cannot trap electrically conductive particles 42 sufficiently. Hence, the protruding portion height/particle size ratio is preferably more than or equal to 30%, more preferably more than or equal to 40%, and still more preferably more than or equal to 42%.

(2-2. Requirement 2)

The opening area ratio of the first electrode terminal 21 is more than or equal to 55%. Here, the opening area ratio is the area ratio of the opening surface of the concavity 23 to the total area of the surface of the first electrode terminal 21. If the opening area ratio is less than 55%, a sufficient number of electrically conductive particles 42 cannot be trapped in the concavity 23. The opening area ratio is preferably more than or equal to 70%. The upper limit value of the opening area ratio is not particularly limited; but if the opening area ratio is too large, the rigidity of the protruding portion 22 may be reduced. Hence, the opening area ratio is preferably less than or equal to 90%.

(2-3. Requirement 3)

The height H2 of the second electrode terminal 31 is more than or equal to 6 μm. Thereby, a sufficient amount of the adhesive flows in also between second electrode terminals 31, and therefore the first electrode terminal 21 and the second electrode terminal 31 are strongly adhered together. Furthermore, even if the protruding portion 22 of the first electrode terminal 21 comes into contact with the second electrode terminal 31, a sufficient amount of the hardened resin layer 41 exists on the lower side of the first electrode terminal 21. Therefore, the protruding portion 22, eventually the first electrode terminal 21 is protected sufficiently by the hardened resin layer 41. As a result, the connection resistance is reduced, and reliability is improved. The upper limit value of the height H2 is not particularly limited, but is preferably less than or equal to 35 μm.

(2-5. Requirement 4)

The ratio of the hardness of the first electrode terminal 21 to the hardness of the second electrode terminal 31 (hereinafter, occasionally referred to as "the hardness ratio of electrode terminals") is preferably larger than 10%. This is because, if the first electrode terminal 21 is much softer than the second electrode terminal 31, the first electrode terminal 21 deforms greatly during compression (that is, during anisotropic conductive connection). If the amount of deformation is large, first electrode terminals 21 may come into contact and short-circuit. The hardness of each electrode terminal is the Vickers hardness, for example. The hardness ratio of electrode terminals is more preferably larger than 15%, and still more preferably larger than 30%. The upper limit value of the hardness ratio of electrode terminals is not particularly limited, and may be approximately 1 (that is, both hardnesses approximately coincide).

(2-6. Requirement 5)

The ratio of the before-compression particle size of the electrically conductive particle 42 to the short side length of the concavity 23 (hereinafter, occasionally referred to as a "particle size/opening short side length ratio") is preferably less than 10%. Here, the short side length of the concavity 23 is the short side length of the shape in a planar view of the concavity 23 (for example, the shape shown in FIG. 2). When the particle size/opening short side length ratio is less than 10%, a larger amount of electrically conductive particles 42 can be trapped in the concavity 23. The particle size/opening short side length ratio is more preferably less than 9%, and still more preferably less than 8.5%. The lower limit value of the particle size/opening short side length ratio is determined by requirement 1. That is, if the particle size/opening short side length ratio is too small, the particle size of the electrically conductive particle 42 is too small, and requirement 1 is not satisfied.

(2-7. Requirement 6)

It is preferable that the average occupation area ratio of electrically conductive particles 42 existing in the concavity 23 be less than 20%. The lower limit of the average occupation area ratio is preferably the occupation area ratio of one or more compressed electrically conductive particles, more preferably the occupation area ratio of two or more compressed electrically conductive particles, and still more preferably the occupation area ratio of three or more compressed electrically conductive particles. Here, the occupation area of each electrically conductive particle 42 is the area obtained when a compressed electrically conductive particle 42 is projected on a horizontal plane. The average occupation area ratio can be measured by the following process. That is, the first electrode terminal 21 is ripped off from the anisotropic conductive connection structure body 10, or the anisotropic conductive connection structure body 10 is ground up to the connection portion, and thereby the connection portion between the first electrode terminal 21 and the second electrode terminal 31 is exposed. Next, 50 exposed connection portions are selected. Next, each connection portion is observed in a surface field of view, and the occupation area of an electrically conductive particle 42 in each connection portion is measured. The observation may be performed with a scanning electron microscope (SEM) or the like. Then, the occupation areas of all the electrically conductive particles 42 existing in the concavity 23 of each connection portion are measured, and the total area of these is divided by the area of the opening surface of the concavity 23. Thereby, the occupation area ratio in each connection portion is measured. Then, these occupation area ratios are arithmetically averaged; thereby, the average occupation area ratio is measured. When the average occupation area ratio is within the range described above, a sufficient amount of electrically conductive particles 42 are trapped in the concavity 23.

If the resilience of the electrically conductive particle 42 is too large, the electrically conductive particle 42 may influence reliability, etc. Thus, the anisotropic conductive connection structure body preferably further satisfies the following requirement, in addition to the requirements described above. That is, the compressive hardness (K value) at the time of 30% deformation of the electrically conductive particle 42 is preferably less than 6000 N/mm², and more preferably less than or equal to 5500 N/mm². Here, the compressive hardness (K value) at the time of 30% deformation is a parameter serving as an index of the compressive strength of the electrically conductive particle 42. The compressive hardness (K value) at the time of 30% deformation is calculated by the following process. That is, the electrically conductive particle 42 is compressed in one direction until the particle size (diameter) of the electrically conductive particle 42 becomes 30% shorter than the original particle size. Then, the compressive hardness (K value) at the time of 30% deformation is calculated on the basis of the load and the amount of displacement at this time, and the radius of the electrically conductive particle 42 before compression, and Mathematical Formula (1) below. According to Mathematical Formula (1), as the K value becomes smaller, the electrically conductive particle 42 is a softer particle.

$$K=(3/\sqrt{2})F\cdot S^{-8/2}\cdot R^{-1/2} \tag{1}$$

In Mathematical Formula (1), F represents the load at the time of 30% compressive deformation of the electrically conductive particle 42, S represents the amount of displacement (mm) of the electrically conductive particle 42 due to compression, and R represents the radius (mm) before compression of the electrically conductive particle 42.

By the above, according to the present embodiment, the height H1 of the protruding portion 22 etc. satisfy prescribed requirements; thus, the quality of the anisotropic conductive connection structure body 10 can be enhanced by utilizing the protruding portion 22. Specifically, the protruding portion 22 can trap a larger amount of electrically conductive particles 42 in the concavity 23 inside the protruding portion 22. Furthermore, electrically conductive particles in the concavity 23 are compressed sufficiently. Therefore, the connection resistance is reduced, and reliability is improved. Furthermore, since the height H2 of the second electrode terminal 31 is a value within a prescribed range, a sufficient amount of the adhesive flows in between second electrode terminals 31. Therefore, the first electrode terminal and the second electrode terminal are strongly adhered together. Furthermore, the present embodiment is applicable as long as there is a line of ACF pressure bonding. Therefore, the present embodiment can be introduced easily.

EXAMPLES

1. Example 1

(1-1. Preparation of First Electronic Part)

An IC chip was prepared as the first electronic part 20. On the IC chip, a plurality of bumps had been formed as first electrode terminals 21. In the first electrode terminal 21, a protruding portion 22 with a height of H1=1.5 µm had been formed. The bump size (that is, the planar shape of the first electrode terminal 21) was a square shape of 50 µm×50 µm. The opening area ratio was 73.96%. Therefore, requirement 2 was satisfied. The Vickers hardness of the first electrode terminal 21 was 50 Hv.

(1-2. Preparation of Second Electronic Part)

A flexible board was prepared as the second electronic part 30. Specifically, a polyimide board with a thickness of 25 µm (CS12-25-00CE, manufactured by Nippon Steel Chemical Co., Ltd.) was subjected to Cu etching and then Ni/Au plating to form the second electrode terminal 31. By the above process, a flexible board was fabricated. The Ni/Au plating was performed by the electrolytic plating method. The height H1 of the second electrode terminal 31 was 12 μm. Therefore, requirement 3 was satisfied. The width of the second electrode terminal 31 was 50 μm. Therefore, the effective connection area between the first electrode terminal 21 and the second electrode terminal 31 was 1849 μm². Here, the effective connection area refers to the area occupied by the second electrode terminal 31 relative to the opening area of the first electrode terminal 21.

The Vickers hardness of the second electrode terminal 31 was 150 Hv. Therefore, the hardness ratio of electrode terminals was 33.3%. Therefore, requirement 4 was satisfied.

(1-3. Preparation of Anisotropic Conductive Film (ACF))

36 parts by mass of a phenoxy resin (product name: YP50, manufactured by Nippon Steel Chemical Co., Ltd.), 36 parts by mass of an epoxy curing agent (product name: HP3941HP, manufactured by Asahi Kasei Chemicals Corporation), 5 parts by mass of an epoxy monomer (product name: HP4032D, manufactured by DIC Corporation), 15 parts by mass of a rubber-modified epoxy resin (product name: XER-91, manufactured by JSR Corporation), 7 parts by mass of a rubber component (product name: SG80H, manufactured by Nagase ChemteX Corporation), a coupling agent (product name: A-187, manufactured by Momentive Performance Materials Japan LLC), and electrically conductive particles 42 (manufactured by Nippon Chemical Industrial Co., Ltd.) were mixed together to prepare an adhesive composition. Here, the electrically conductive particles 42 were blended to the adhesive composition such that the number density was 3,500,000/mm³. Then, the adhesive composition was applied with a bar coater to a separately prepared release-treated PET film with a thickness of 38 μm, and drying was performed; thus, an anisotropic conductive film with a thickness of 40 μm was obtained.

The before-compression particle size of the electrically conductive particle 42 was 3.5 μm, and Ni/Au plating had been performed on the electrically conductive particle 42. Therefore, the protruding portion height/particle size ratio was 42.85%. Therefore, requirement 1 was satisfied. Further, the particle size/opening short side length ratio was 8.14%. Therefore, requirement 5 was satisfied. By the above, it has been checked that Example 1 satisfied requirements 1 to 5. Further, the compressive hardness at the time of 30% deformation of the electrically conductive particle 42 was 5500 N/mm². The compressive hardness at the time of 30% deformation was measured with a micro-compression testing machine manufactured by Shimadzu Corporation. In all the electrically conductive particles 42 used in Examples and Comparative Examples below, the compressive hardness at the time of 30% deformation was 5500 N/mm².

(1-4. Fabrication of Anisotropic Conductive Connection Structure Body)

The first electronic part 20, the anisotropic conductive film, and the second electronic part 30 were sequentially stacked. Here, the alignment of the first electronic part 20 and the second electronic part 30 was performed such that the positions of the first electrode terminal 21 and the second electrode terminal 31 coincided. Next, a heat tool was pressed against the second electronic part 30 via a buffer material or the like. Next, the heat tool was used to bond the first electrode terminal 21 and the second electrode terminal 31 together by thermocompression bonding. By the above process, the anisotropic conductive connection structure body 10 was fabricated. Here, the conditions of thermocompression bonding were set to 200° C.-10 sec-100 MPa. That is, while the temperature of the heat tool was increased such that the temperature of the heat tool became 200° C. in 10 seconds from the start of pressure bonding, the first electrode terminal 21 and the second electrode terminal 31 were bonded together by thermocompression bonding at a pressure of 100 MPa for 10 seconds. A plurality of anisotropic conductive connection structure bodies 10 were fabricated for evaluation described later. The configurations of the anisotropic conductive connection structure bodies 10 are collectively shown in Table 1.

(1-5. Initial Resistance)

The connection resistance of the anisotropic conductive connection structure body 10 fabricated in 1-4. was measured using a digital multimeter (product name: Digital Multimeter 7561, manufactured by Yokogawa Electric Corporation). The results are collectively shown in Table 1. Here, initial resistances in a plurality of connection portions were measured. In Table 1, the range of the measurement value is shown.

(1-6. Reliability Evaluation)

Reliability was evaluated by performing a cooling/heating cycle test of the anisotropic conductive connection structure body 10 fabricated in 1-4. In the cooling/heating cycle test, 500 cooling/heating cycles were performed in which exposing the anisotropic conductive connection structure body 10 to a −40° C. atmosphere for 30 minutes and to a 100° C. atmosphere for 30 minutes was taken as 1 cycle. Next, 400 connection portions of the anisotropic conductive connection structure body 10 were extracted, and the number of defective portions (channels exhibiting a resistance of more than or equal to 100 mΩ) among these was counted. The results are collectively shown in Table 1.

(1-7. Measurement of Occupation Area Ratio Etc.)

The first electrode terminal 21 was ripped off from the anisotropic conductive connection structure body 10, and thereby the connection portion was exposed. Next, the connection portion was observed with a SEM, and the number of electrically conductive particles 42 existing in the concavity 23 (that is, the number of trapped particles) and the average occupation area ratio of electrically conductive particles 42 were measured. The measurement of the average occupation area ratio was performed by the method described above. That is, 50 connection portions to be measured were observed in a surface field of view, and the area where particles occupied, that is, the occupation area was measured. Then, the occupation area ratio was calculated on the basis of the occupation area. The arithmetic average value of the number of electrically conductive particles 42 measured for 50 connection portions was taken as the number of trapped electrically conductive particles 42. The results are collectively shown in Table 1.

2. Example 2

In Example 2, a similar treatment to Example 1 was performed except that the Vickers hardness of the first electrode terminal 21 was set to 90 Hv. In Example 2, the hardness ratio of electrode terminals was 60%. Therefore, also in Example 2, requirement 4 was satisfied. The configuration and evaluation results of the anisotropic conductive connection structure body 10 are collectively shown in Table 1.

3. Example 3

In Example 3, a similar treatment to Example 1 was performed except that the Vickers hardness of the first electrode terminal 21 was set to 20 Hv. In Example 3, the hardness ratio of electrode terminals was 13.3%. Therefore, also in Example 3, requirement 4 was satisfied. However, the hardness ratio was less than or equal to 30%, and hence a little deformation of the first electrode terminal 21 was observed. The configuration and evaluation results of the anisotropic conductive connection structure body 10 are collectively shown in Table 1.

4. Example 4

In Example 4, a similar treatment to Example 1 was performed except that the Vickers hardness of the second electrode terminal 31 was set to 500 Hv. Specifically, the plating of the second electrode terminal 31 was performed by electroless plating, and thereby the Vickers hardness mentioned above was obtained. In Example 4, the hardness ratio of electrode terminals was 10%. Therefore, in Example 4, requirement 4 was not satisfied. Hence, the first electrode terminal 21 was largely deformed after pressure bonding. However, the pitch of the first electrode terminal 21 was set relatively wide, and consequently a short circuit did not occur. The configuration and evaluation results of the anisotropic conductive connection structure body 10 are collectively shown in Table 1.

5. Example 5

In Example 5, a similar treatment to Example 1 was performed except that the width of the second electrode terminal 31 was set to 40 μm. The configuration and evaluation results of the anisotropic conductive connection structure body 10 are collectively shown in Table 1.

6. Example 6

In Example 6, a similar treatment to Example 1 was performed except that the particle size of the electrically conductive particle 42 was set to 3.0 μm. The configuration and evaluation results of the anisotropic conductive connection structure body 10 are collectively shown in Table 1.

7. Example 7

A similar treatment to Example 1 was performed except that the width of the second electrode terminal 31 was set to 30 μm. The configuration and evaluation results of the anisotropic conductive connection structure body 10 are collectively shown in Table 1.

8. Example 8

A similar treatment to Example 1 was performed except that the width of the second electrode terminal 31 was set to 20 μm. The configuration and evaluation results of the anisotropic conductive connection structure body 10 are collectively shown in Table 1.

9. Example 9

A similar treatment to Example 1 was performed except that the height H2 of the second electrode terminal 31 was set to 6 μm. The configuration and evaluation results of the anisotropic conductive connection structure body 10 are collectively shown in Table 1.

10. Comparative Example 1

A similar treatment to Example 1 was performed except that the before-compression particle size of the electrically conductive particle 42 was set to 2.5 μm. Therefore, the protruding portion height/particle size ratio was 60%, and hence requirement 1 was not satisfied. The configuration and evaluation results of the anisotropic conductive connection structure body 10 are collectively shown in Table 2.

11. Comparative Example 2

A similar treatment to Example 1 was performed except that the opening area ratio of the first electrode terminal 21 was set to 51.84%. Therefore, in Comparative Example 2, requirement 2 was not satisfied. The configuration and evaluation results of the anisotropic conductive connection structure body 10 are collectively shown in Table 2.

12. Comparative Example 3

A similar treatment to Example 1 was performed except that the height H1 of the protruding portion 22 was set to 3.0 μm. Therefore, in Comparative Example 3, the protruding portion height/particle size ratio was 85.71%, and hence requirement 1 was not satisfied. The configuration and evaluation results of the anisotropic conductive connection structure body 10 are collectively shown in Table 2.

13. Comparative Example 4

A similar treatment to Example 1 was performed except that the protruding portion 22 was removed from the first electrode terminal 21 by grinding and the width of the second electrode terminal 31 was set to 20 μm. Therefore, in Comparative Example 4, at least requirement 1 was not satisfied. The configuration and evaluation results of the anisotropic conductive connection structure body 10 are collectively shown in Table 2.

14. Comparative Example 5

A similar treatment to Example 1 was performed except that a glass board was used as the second electronic part 30. A second electrode terminal 31 made of ITO was formed on the glass board, and the height H2 of the second electrode terminal 31 was less than or equal to 1 μm. Therefore, in Comparative Example 5, requirement 3 was not satisfied. The configuration and evaluation results of the anisotropic conductive connection structure body 10 are collectively shown in Table 2.

15. Reference Example 1

A similar treatment to Example 1 was performed except that the protruding portion 22 was removed from the first electrode terminal 21 by grinding and the width of the second electrode terminal 31 was set to 40 μm. Therefore, in Reference Example 1, at least requirement 1 was not satisfied. The configuration and evaluation results of the anisotropic conductive connection structure body 10 are collectively shown in Table 2.

16. Reference Example 2

A similar treatment to Example 1 was performed except that the protruding portion 22 was removed from the first electrode terminal 21 by grinding and the width of the second electrode terminal 31 was set to 30 μm. Therefore, in Reference Example 1, at least requirement 1 was not satisfied. The configuration and evaluation results of the anisotropic conductive connection structure body 10 are collectively shown in Table 2.

TABLE 1

|  | Example 1 | Example 2 | Example 3 | Example 4 | Example 5 | Example 6 | Example 7 | Example 8 | Example 9 |
|---|---|---|---|---|---|---|---|---|---|
| Before-compression particle size (μm) | 3.5 | 3.5 | 3.5 | 3.5 | 3.5 | 3.0 | 3.5 | 3.5 | 3.5 |
| Compressive hardness at time of 30% deformation of electrically conductive particle (K value) (N/mm$^2$) | 5500 | 5500 | 5500 | 5500 | 5500 | 5500 | 5500 | 5500 | 5500 |
| Bump size (μm × μm) | 50*50 | 50*50 | 50*50 | 50*50 | 50*50 | 50*50 | 50*50 | 50*50 | 50*50 |
| Opening area ratio (%) | 73.96 | 73.96 | 73.96 | 73.96 | 73.96 | 73.96 | 73.96 | 73.96 | 73.96 |
| Height H1 of protruding portion (μm) | 1.5 | 1.5 | 1.5 | 1.5 | 1.5 | 1.5 | 1.5 | 1.5 | 1.5 |
| Particle size/opening short side length ratio | 8.1 | 8.1 | 8.1 | 8.1 | 8.1 | 7.0 | 8.1 | 8.1 | 8.1 |
| Width of second electrode terminal (μm) | 50 | 50 | 50 | 50 | 40 | 50 | 30 | 20 | 50 |
| Height H2 of second electrode terminal (μm) | 12 | 12 | 12 | 12 | 12 | 12 | 12 | 12 | 6 |
| Effective connection area (μm$^2$) | 1849 | 1849 | 1849 | 1849 | 1720 | 1849 | 1290 | 860 | 1849 |
| Protruding portion height/particle size ratio (%) | 42.85 | 42.85 | 42.85 | 42.85 | 42.85 | 50.00 | 42.85 | 42.85 | 42.85 |
| Hardness of first electrode terminal (Hv) | 50 | 90 | 20 | 50 | 50 | 50 | 50 | 50 | 50 |
| Hardness of second electrode terminal (Hv) | 150 | 150 | 150 | 500 | 150 | 150 | 150 | 150 | 150 |
| Hardness ratio of electrode terminals (%) | 33.3 | 60 | 13.3 | 10 | 33.3 | 33.3 | 33.3 | 33.3 | 33.3 |
| Number of trapped particles | 22 | 23 | 21 | 23 | 21 | 28 | 15 | 10 | 21 |
| Initial resistance (mΩ) | less than or equal to 100 | less than or equal to 100 | less than or equal to 100 | less than or equal to 100 | less than or equal to 100 | less than or equal to 100 | less than or equal to 100 | less than or equal to 100 | less than or equal to 100 |
| Fraction defective | 0/400 | 0/400 | 0/400 | 0/400 | 0/400 | 0/400 | 0/400 | 0/400 | 0/400 |
| Occupation area ratio (%) | 18.9 | 19.8 | 18.1 | 19.8 | 19.4 | 17.7 | 18.5 | 18.5 | 18.1 |

TABLE 2

|  | Comparative Example 1 | Comparative Example 2 | Comparative Example 3 | Comparative Example 4 | Comparative Example 5 | Reference Example 1 | Reference Example 2 |
|---|---|---|---|---|---|---|---|
| Before-compression particle size (μm) | 2.5 | 3.5 | 3.5 | 3.5 | 3.5 | 3.5 | 3.5 |
| Compressive hardness at time of 30% deformation of electrically conductive particle (K value) (N/mm$^2$) | 5500 | 5500 | 5500 | 5500 | 5500 | 5500 | 5500 |
| Bump size (μm × μm) | 50*50 | 50*50 | 50*50 | 50*50 | 50*50 | 50*50 | 50*50 |
| Opening area ratio (%) | 73.96 | 51.84 | 73.96 | 100.00 | 73.96 | 100.00 | 100.00 |
| Height H1 of protruding portion (μm) | 1.5 | 1.5 | 3 | 0 | 1.5 | 0 | 0 |
| Particle size/opening short side length ratio | 5.8 | 10 | 8.1 | — | 8.1 | — | — |
| Width of second electrode terminal (μm) | 50 | 50 | 50 | 20 | 50 | 40 | 30 |

TABLE 2-continued

|  | Comparative Example 1 | Comparative Example 2 | Comparative Example 3 | Comparative Example 4 | Comparative Example 5 | Reference Example 1 | Reference Example 2 |
| --- | --- | --- | --- | --- | --- | --- | --- |
| Height H2 of second electrode terminal (μm) | 12 | 12 | 12 | 12 | less than or equal to 1 | 12 | 12 |
| Effective connection area (μm$^2$) | 1849 | 1296 | 1849 | 1000 | 1849 | 2000 | 1500 |
| Protruding portion height/particle size ratio (%) | 60.00 | 42.85 | 85.71 | 0 | 42.85 | 0 | 0 |
| Hardness of first electrode terminal (Hv) | 50 | 50 | 50 | 50 | 50 | 50 | 50 |
| Hardness of second electrode terminal (Hv) | 150 | 150 | 150 | 150 | 150 | 150 | 150 |
| Hardness ratio of electrode terminals (%) | 33.3 | 33.3 | 33.3 | 33.3 | 33.3 | 33.3 | 33.3 |
| Number of trapped particles | 32 | 4 | 24 | 3 | 22 | 11 | 9 |
| Initial resistance (mΩ) | less than or equal to 100 | less than or equal to 100 | less than or equal to 100 | less than or equal to 100 | less than or equal to 1000 | less than or equal to 100 | less than or equal to 100 |
| Fraction defective | 3/400 | 2/400 | 7/400 | 11/400 | 37/400 | 0/400 | 0/400 |
| Occupation area ratio (%) | 14 | 4.9 | 20.6 | 4.8 | 18.9 | 8.7 | 9.5 |

In Examples 1 to 3 and 5 to 9, all requirements 1 to 6 are satisfied, and therefore good results were obtained for all of the initial resistance, the fraction defective, and the peel strength. In these Examples, a sufficient number of electrically conductive particles 42 were able to be trapped in the concavity 23 by the protruding portion 22. Furthermore, these electrically conductive particles 42 were able to be compressed sufficiently. It is presumed that good results were obtained by these.

However, in Example 3, a little deformation was observed in the first electrode terminal 21. In Example 3, the hardness ratio of electrode terminals is less than or equal to 30%. That is, in Example 3, although requirement 4 is satisfied, a value of less than or equal to 30% has been obtained. Further, although good results were obtained also in Example 4, the deformation of the first electrode terminal 21 was still larger. In Example 4, the hardness ratio of electrode terminals is less than or equal to 10%. Therefore, requirement 4 is not satisfied. Thus, it has been found that requirement 4 being satisfied is preferable from the viewpoint of suppressing the deformation of the electrode terminal.

On the other hand, in Comparative Examples 1 to 5, particularly the evaluation of reliability was poor. In Comparative Examples 1 to 5, such results were obtained presumably because not all of requirements 1 to 3 were satisfied. In Reference Examples 1 and 2, the protruding portion 22 was not formed. Hence, the number of trapped particles was smaller than in Examples. However, evaluation results almost equal to those of Examples were obtained. On the other hand, in Comparative Example 4, in which the protruding portion 22 was not formed either, the evaluation results were poor. As a reason for this, the fact that the effective connection area was large in Reference Examples 1 and 2 is given. However, in Reference Examples 1 and 2, the working of removing the protruding portion 22 is needed separately, and hence the anisotropic conductive connection takes time and effort. Therefore, it can be said that Examples 1 to 9 are preferable.

The preferred embodiment(s) of the present invention has/have been described above with reference to the accompanying drawings, whilst the present invention is not limited to the above examples. A person skilled in the art may find various alterations and modifications within the scope of the appended claims, and it should be understood that they will naturally come under the technical scope of the present invention.

REFERENCE SIGNS LIST

10 anisotropic conductive connection structure body
20 first electronic part
21 first electrode terminal
22 protruding portion
23 concavity
30 second electronic part
31 second electrode terminal
40 adhesive layer
41 hardened resin layer
42 electrically conductive particle

The invention claimed is:

1. An anisotropic conductive connection structure body comprising:
a first electrode terminal on a surface of which a protruding portion is formed;
a second electrode terminal; and
an anisotropic conductive adhesive layer containing electrically conductive particles that provide conduction between the first electrode terminal and the second electrode terminal,
wherein a ratio of a height of the protruding portion to a before-compression particle size of the electrically conductive particles is less than 60%,
an opening area ratio of the first electrode terminal is more than or equal to 55%, and
a height of the second electrode terminal is more than or equal to 6 μm.
2. The anisotropic conductive connection structure body according to claim 1, wherein a ratio of a hardness of the first electrode terminal to a hardness of the second electrode terminal is larger than 10%.

3. The anisotropic conductive connection structure body according to claim 1,
wherein a concavity surrounded by the protruding portion is formed on the surface of the first electrode terminal, and
a ratio of the before-compression particle size of the electrically conductive particles to a short side length of the concavity of the first electrode terminal is less than 10%.

4. The anisotropic conductive connection structure body according to claim 1,
wherein a concavity surrounded by the protruding portion is formed on the surface of the first electrode terminal, and
an average occupation area ratio of the electrically conductive particles existing in the concavity of the first electrode terminal is less than 20%.

5. The anisotropic conductive connection structure body according to claim 1,
wherein the protruding portion is formed over an entire outer edge of the surface of the first electrode terminal.

6. The anisotropic conductive connection structure body according to claim 1,
wherein the first electrode terminal is a bump formed on a first electronic part.

* * * * *